(12) United States Patent
Bibeau et al.

(10) Patent No.: US 12,068,422 B2
(45) Date of Patent: Aug. 20, 2024

(54) SYSTEMS AND METHODS FOR COOLING ELECTRONICS

(71) Applicant: Simmonds Precision Products, Inc., Vergennes, VT (US)

(72) Inventors: Craig R. Bibeau, Shakopee, MN (US); Jason Graham, Prior Lake, MN (US)

(73) Assignee: Simmonds Precision Products, Inc., Vergennes, VT (US)

(*) Notice: Subject to any disclaimer, the term of this patent is extended or adjusted under 35 U.S.C. 154(b) by 375 days.

(21) Appl. No.: 17/497,874

(22) Filed: Oct. 8, 2021

(65) Prior Publication Data

US 2023/0112805 A1  Apr. 13, 2023

(51) Int. Cl.
*H01L 31/024* (2014.01)
*H01L 23/427* (2006.01)
*H01L 23/473* (2006.01)

(52) U.S. Cl.
CPC .......... *H01L 31/024* (2013.01); *H01L 23/427* (2013.01); *H01L 23/473* (2013.01)

(58) Field of Classification Search
CPC ... H01L 23/46; H01L 23/473; H01L 23/4735; H01L 23/467; H01L 23/24
See application file for complete search history.

(56) References Cited

U.S. PATENT DOCUMENTS

| | | | |
|---|---|---|---|
| 4,621,279 A | 11/1986 | Maier et al. | |
| 4,659,037 A | 4/1987 | Unterstein | |
| 4,923,143 A | 5/1990 | Steuer et al. | |
| 5,184,470 A * | 2/1993 | Moser | F25D 5/00 62/4 |
| 5,348,250 A | 9/1994 | Semler et al. | |
| 5,522,452 A * | 6/1996 | Mizuno | H01L 23/4336 165/286 |
| 6,571,569 B1* | 6/2003 | Rini | F25B 19/02 62/304 |
| 6,603,662 B1* | 8/2003 | Ganrot | H01L 23/4336 361/698 |
| 10,018,456 B2 | 7/2018 | Lyons et al. | |
| 10,156,402 B1* | 12/2018 | Carlson | H01L 23/427 |
| 10,627,199 B1* | 4/2020 | Denton | F25B 19/005 |
| 2001/0002541 A1* | 6/2001 | Patel | H01L 23/4735 62/171 |
| 2006/0262503 A1* | 11/2006 | Bevan | H01L 23/4735 361/699 |
| 2009/0294106 A1* | 12/2009 | Flotta | H01L 23/4735 165/104.33 |

(Continued)

OTHER PUBLICATIONS

Extended European Search Report issued in corresponding EP Patent Application No. 22200604.1, dated Mar. 9, 2023.

*Primary Examiner* — Nelson J Nieves
(74) *Attorney, Agent, or Firm* — Schwegman Lundberg & Woessner, P.A.

(57) ABSTRACT

In accordance with at least one aspect of this disclosure, a thermal management system for an electronics assembly includes, a reservoir housing a compressible fluid in a compressed state, a throttling orifice disposed in fluid communication with the reservoir and configured to expand the compressible fluid, cooling the compressible fluid, and a heat exchange volume in fluid communication with the throttling orifice to receive cooled compressible fluid from the throttling orifice.

18 Claims, 8 Drawing Sheets

(56) References Cited

U.S. PATENT DOCUMENTS

| | | | |
|---|---|---|---|
| 2012/0160459 A1* | 6/2012 | Flotta | H05K 7/20327 |
| | | | 165/104.11 |
| 2017/0082326 A1* | 3/2017 | Fisher | H01L 23/4735 |
| 2017/0196120 A1* | 7/2017 | Oprins | H05K 7/20272 |
| 2019/0010844 A1* | 1/2019 | Nakanishi | F01N 3/202 |
| 2019/0166717 A1 | 5/2019 | Gass et al. | |
| 2020/0139373 A1* | 5/2020 | Sasaki | B01L 3/502715 |
| 2021/0098336 A1* | 4/2021 | Shao | H01L 23/467 |
| 2021/0210363 A1* | 7/2021 | Sakurai | H01L 21/67051 |
| 2021/0301942 A1* | 9/2021 | Matsuda | H01J 37/32935 |
| 2021/0351106 A1* | 11/2021 | Subrahmanyam | |
| | | | G01R 31/2642 |
| 2021/0379725 A1* | 12/2021 | Sridhar | B33Y 70/00 |
| 2022/0238311 A1* | 7/2022 | Kubo | H01J 37/32816 |
| 2022/0267898 A1* | 8/2022 | Salinas | C23C 16/34 |
| 2022/0395869 A1* | 12/2022 | Ho | H01L 21/67051 |
| 2023/0005740 A1* | 1/2023 | Brady | C23C 16/4404 |
| 2023/0366119 A1* | 11/2023 | Thorkelsson | H01L 21/67028 |

* cited by examiner

SYSTEMS AND METHODS FOR COOLING ELECTRONICS

TECHNICAL FIELD

The present disclosure relates to thermal management, e.g. for use in electronics assemblies.

BACKGROUND

Heatsinks, phase change materials, thermal electric coolers, and cryogenic coolers can be used to cool certain, isolated, components in an electronic assembly, such as infrared sensors, or on infrared seekers to cool the seeker to bring the signal noise floor down such that normal temperature targets in the infrared bands can be visualized. However, cooling the infrared sensor does not cool all components in the electronics assembly, including those that are heat-generating, such as electro optical infrared (EOIR) image processor, RF antenna, and RF processors, Canard Actuation System electronics, and the like. Accordingly, there remains a need in the art for cooling systems and methods to cool seeker electronics, for example to maintain a component temperature within the operating range of the electronics.

Accordingly, there remains a need in the art for cooling systems and methods to cool seeker electronics, for example to maintain seeker temperature within the operating range of the electronics. This disclosure provides a solution for this need.

SUMMARY

In accordance with at least one aspect of this disclosure, a thermal management system for an electronics assembly includes, a reservoir housing a compressible fluid in a compressed state, a throttling orifice disposed in fluid communication with the reservoir and configured to expand the compressible fluid, cooling the compressible fluid, and a heat exchange volume in fluid communication with the throttling orifice to receive cooled compressible fluid from the throttling orifice.

In embodiments, the system can include an exhaust path fluidly connecting the heat exchange volume to an ambient environment external to the volume via an exhaust path outlet. In embodiments, the thermal management system can be configured to cool an electronics assembly within a moving platform. In certain embodiments, the moving platform can be or include a guided munition.

In embodiments, the cooled compressible fluid can be in fluid communication with the heat exchange volume to cool the heat exchange volume through convection, and the heat exchange volume can be in thermal communication with a heat generating electronics component of the electronics assembly to remove heat from the heat generating electrics component through conduction.

In certain embodiments, the heat exchange volume can be configured to direct the cooled compressible fluid from the throttling orifice outlet to and along a centerline of the heat generating electronics component, then outward from the centerline to the exhaust path outlet. In certain embodiments, the heat exchange volume can be configured to direct the cooled compressible fluid from the throttling orifice outlet to a periphery of the heat generating electronics component, then inward to a centerline of the heat generating electronics component, then outward from the centerline to the exhaust path outlet.

In certain embodiments, the heat exchange volume can be configured to direct the cooled compressible fluid from the throttling orifice outlet to a location aft of the heat generating electronics component, then along the heat generating electronics component to a location forward of the heat generating electronics component and to the exhaust path outlet. In certain embodiments, the heat exchange volume can be configured to direct the cooled compressible fluid from the throttling orifice outlet to a location forward of the heat generating electronics, then along the heat generating electronics to a location aft of the heat generating electronics and to the exhaust path outlet.

In certain embodiments, the heat exchange volume can be in thermal communication with a cooling path housing a working fluid, and is configured to exchange heat between the working fluid and the compressible fluid in the heat exchange volume while maintaining fluid isolation between the compressible fluid and the working fluid, wherein the working fluid is thermal communication with a heat generating electronics component to cool the heat generating electronics component.

In certain embodiments, the reservoir can include a passive pressure release mechanism configured to retain the compressible fluid at a first predetermined pressure and configured to allow discharge of the compressible fluid at a second predetermined pressure. In certain embodiments, the reservoir can be configured to discharge the compressible fluid upon acceleration of the moving platform. In certain embodiments, the reservoir can include an actuated discharge valve, and further comprising a controller operatively connected to control the actuated discharge valve to discharge the compressible fluid at a predetermined time. In certain embodiments, the reservoir can include an active pressure release mechanism configured to retain the compressible fluid at a first predetermined pressure and configured to allow discharge of the compressible fluid at a second predetermined pressure. In embodiments, the compressible fluid can include at least one of carbon dioxide, nitrogen, argon, neon and/or krypton.

In accordance with at least one aspect of this disclosure, a moving platform can include a platform body, an electronics assembly housed within the platform body, the electronics assembly comprising an electronics component, and a thermal management system configured to cool the electronics assembly. In embodiments, the thermal management system can include a reservoir disposed in the platform body, housing a compressible fluid in a compressed state, a throttling orifice disposed in fluid communication with the reservoir and configured to expand the compressible fluid, cooling the compressible fluid, a heat exchange volume in fluid communication with the throttling orifice to receive cooled compressible fluid from the throttling orifice. In certain embodiments, the thermal management system can be separate from an infrared (IR) sensor within the platform body, such that the IR sensor can be cooled by a separate thermal management system. In certain embodiments, the thermal management system can be separate from at least one additional electronics component including a radio frequency (RF) seeker or other, a datalink, and/or an RF communication module, such that the at least one additional electronics can be cooled by a separate thermal management system.

In certain embodiments, the reservoir can be positioned in the platform body such that the reservoir is configured to absorb heat from the inside the platform body. In certain embodiments, the reservoir can include at least one reservoir. In certain such embodiments, the at least one reservoir can be housed in at least one of a nose of the platform body and/or in thermal communication with an outer shell of the platform body.

In accordance with at least one aspect of this disclosure, a method of cooling an electronics assembly of a moving platform can include discharging a compressible fluid from an onboard reservoir into a heat exchange volume of the moving platform, expanding the compressible fluid to cool the compressible fluid, flowing the cooled compressible fluid through the heat exchange volume into thermal communication with a heat generating electronics component of the electronics assembly, and exhausting the compressible fluid to an ambient environment external to the volume.

In certain embodiments, expanding the compressible fluid can include passing the compressible fluid through a throttling orifice, and further comprising controlling a temperature drop of the compressible fluid with the throttling orifice. In embodiments, the method can further include monitoring a temperature of the electronics component, monitoring a temperature of the heat exchange volume, and controlling at least one of discharge of the compressible fluid and/or expansion of the compressible fluid as a function the temperature of the electronics component and the temperature of the heat exchange volume.

In accordance with at least one aspect of this disclosure, an actuation system for a guided munition, includes a reservoir disposed in a guided munition body housing a compressible fluid in a compressed state, a fluid path connecting the reservoir in fluid communication with a heat exchange volume, a throttling orifice disposed in the fluid path configured to expand the compressible fluid, and an actuation path connecting the heat exchange volume in fluid communication with a moveable component. The actuation path can be configured to supply pneumatic pressure to the moveable component.

In embodiments, the reservoir can further include an actuated discharge valve and the actuation system can include a controller operatively connected to control the discharge valve to discharge the compressible fluid at a predetermined time. In embodiments, the fluid path can be configured to cool the heat exchange volume in the fluid path prior to entering the actuation path. In embodiments, the actuation system can include an exhaust outlet defined in the guided munition body in fluid communication with the actuation path, and configured to exhaust the compressible fluid from the actuation path to an ambient environment external to the guided munition body.

In certain embodiments, the moveable component can be or include a nose cone segment mounted to the guided munition housing. In certain embodiments, the actuation system can be included in the guided munition body. In certain such embodiments the fluid path can be configured to direct the compressible fluid from the throttling orifice outlet to the heat exchange volume and the actuation path can be configured to direct the compressible fluid from the heat exchange volume toward a respective nose cone segment to move the nose cone segment from a stowed position to a deployed position.

In certain embodiments, the actuation system can be included in a nose cone mounted the guided munition body. In certain such embodiments, the fluid path can be configured to direct the compressible fluid from the throttling orifice outlet to the heat exchange volume and the actuation path can be configured to direct the compressible fluid from the heat exchange volume away from a respective nose cone segment to move the respective nose cone segment from a stowed position to a deployed position. In certain embodiments, the actuation system can be configured to be ejected from the guided munition body with the respective nose cone segment upon deployment of the respective nose cone segment.

In certain embodiments, the moveable component can be or include a canard. In certain such embodiments, the actuation system can be included in the guided munition body such that the fluid path can be configured to direct the compressible fluid from the throttling orifice outlet to the heat exchange volume and the actuation path can be configured to direct the compressible fluid from the heat exchange volume toward a respective canard to move the respective canard from a stowed position to a deployed position.

In certain embodiments, the moveable component can include a wing mounted to the guided munition body. In certain such embodiments, the fluid path can be configured to direct the compressible fluid from the throttling orifice outlet to the heat exchange volume and the actuation path is configured to direct the compressible fluid from the heat exchange volume toward a respective wing to move the respective wing from a stowed position to a deployed position.

In accordance with at least one aspect of this disclosure, a guided munition can include, a guided munition body, a moveable component mounted for movement relative to the guided munition body, and an actuation system configured to move the moveable component. The actuation system can be as described herein above.

In accordance with at least one aspect of this disclosure, a method can include, discharging a compressible fluid from an onboard reservoir into a body of a guided munition, expanding the compressible fluid though a throttling orifice, flowing the compressible fluid through a fluid path from the throttling orifice to a heat exchange volume, exhausting the compressible fluid from the heat exchange volume to an actuation path of a moveable component of the guided munition, and actuating the moveable component with the exhausted compressible fluid. In embodiments, actuating the moveable component can include actuating at least one of a respective nose cone segment mounted to the guided munition body, a respective canard mounted to the guided munition body, and/or a respective wing mounted to the guided munition body.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
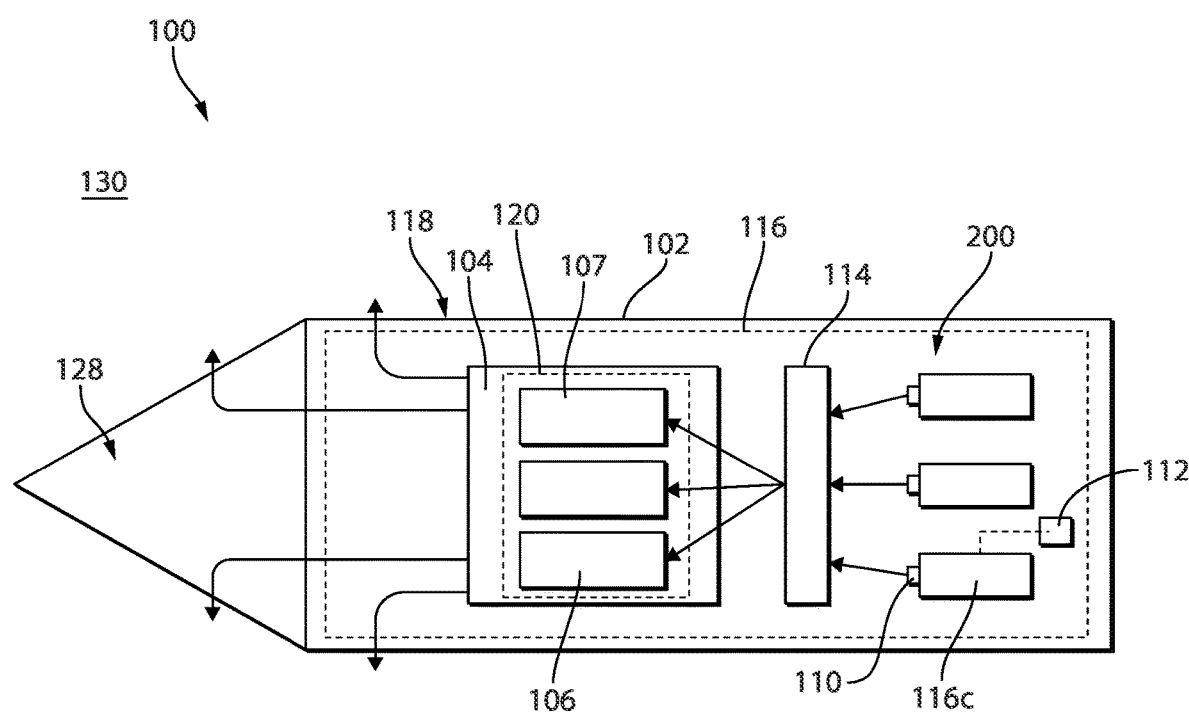
FIG. 1 is a schematic plan view of a guided munition in accordance with this at least one aspect of this disclosure, showing; a thermal management system.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-8. Certain embodiments described herein can be used to remove heat from the source heat generating electronics to maintain the electronics components below max operating temperatures, operating more efficiently, and prevent failure due to over temperature situations. In embodiments, systems as disclosed herein can be used for actuation in guided munitions or other applications having one time use electronics.

In accordance with at least one aspect of this disclosure, a moving platform 100 (e.g., a guided munition) can include a platform body 102, an electronics assembly 104 housed within the platform body 102, comprising an electronics component 106, and a thermal management system 200 (e.g., utilizing a Joule-Thompson cooler) configured to cool the electronics assembly 104. The thermal management system 200 can include, a reservoir 108 housing a compressible fluid (e.g., any suitable gas or liquid as needed or desired) in a compressed state.

In embodiments, the compressible fluid can includes at least one of carbon dioxide, nitrogen, argon, neon and/or krypton. Any other suitable fluid, combination and/or mixture of the listed fluids is contemplated herein, for example fluids having a temperature range being below its inversion temperature as defined in a concept of operations (CONOP), and fluids having non-flammable nature. In certain embodiments, the compressible fluid(s) can be tailored for specific CONOP thermal profiles, duration and thermal load required.

In embodiments, the reservoir 108 can be a single storage container or any suitable number of storage containers (e.g., three as shown). In certain embodiments, the reservoir 108 can include a single container having a multi-celled structure. The reservoir 108 can include a release mechanism 110 for discharging the compressible fluid. In certain embodiments, the reservoir 108 can be configured to discharge the compressible fluid upon acceleration of the moving platform 100 (e.g., utilizing the high level of accelerations present within a gun launch), for example, setback, set-forward or balloting accelerations could be used in conjunction with mechanical features that could cause discharge the compressible fluid upon acceleration. In certain embodiments, the release mechanism 110 can be or include a passive pressure release mechanism 110 configured to retain the compressible at a first pressure (e.g., the highest pressure allowed by the passive pressure release mechanism) until a second predetermined pressure is reached (e.g., greater than the first pressure) and/or upon acceleration of the moving platform 100, at which time the compressible fluid can be discharged to a pressure that is lower than the pressure at which it was stored. For example, the passive pressure release mechanism 110 can include a pierceable membrane, such as a frangible diaphragm, or a burst disk.

Figure 2:
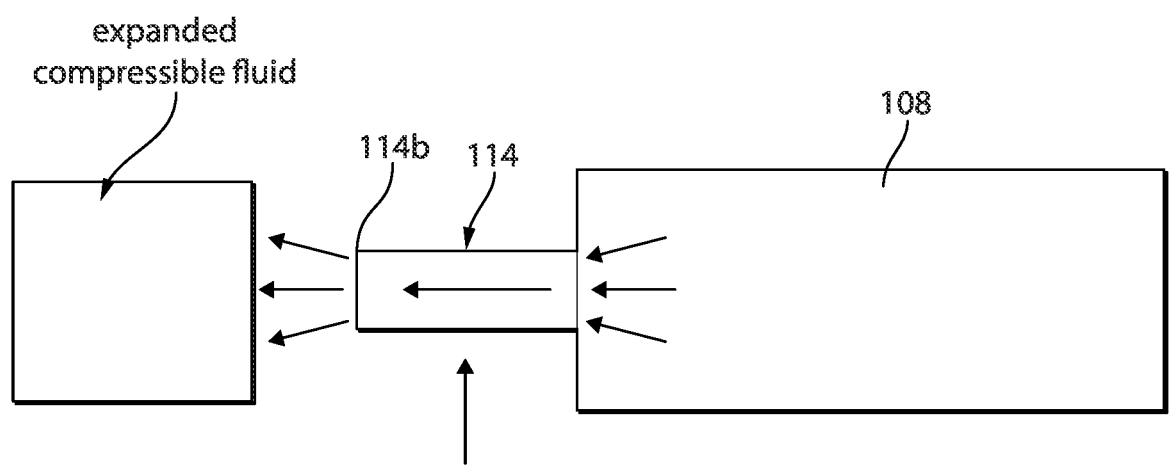
FIG. 2, is a schematic plan view of a throttling orifice of the thermal management system of FIG. 1.

In certain embodiments, the release mechanism 110 can be or include an actuated discharge valve, controllable by a thermal management system controller 112. In embodiments, the controller 112 can include machine readable instruction operative to control the discharge valve 110 to discharge the compressible fluid at a predetermined time, such as defined in a CONOP, for example, when the temperature gradient is needed the most. In certain embodiments, the release mechanism 110 can be or include an active pressure release mechanism, such as a squib or other suitable explosive. In this case, a blockage may be configured to retain the compressible fluid at a first predetermined pressure and configured to allow discharge of the compressible fluid upon detonation of the squib. A throttling orifice 114 is disposed in fluid communication with the reservoir 108 and can be configured to expand the compressible fluid, such as shown in FIG. 2, where expanding the compressible fluid produces a cooling effect to cool the compressible fluid.

A heat exchange volume 116 can be in fluid communication with the throttling orifice 114 to receive cooled compressible fluid from the throttling orifice 114. In embodiments, the cooled compressible fluid can be in fluid communication with the heat exchange volume 116 to cool the heat exchange volume 116 by convection, and the heat exchange volume 116 can be in thermal communication with the heat generating electronics component 106 (e.g., at or directly on, or near the component 106) of the electronics assembly 104 to remove heat from the heat generating electrics component 106 through conduction, e.g. heat conducts out of the heat generating component 106 to its surface and is convected away by the cooled, compressed gas either directly from the surface of the heat generating component 106 or a heat sink associated with it.

The heat exchange volume 116 can be any suitable heat exchange volume, such as a multi fluid heat exchanger, a single fluid heat sink, or the like. In certain embodiments, the heat exchange volume 116 can be the reservoir 108 itself, such that as the compressible fluid is discharged, the cooled reservoir 108 can absorb ambient heat within the platform body 102. In certain instances, it may be beneficial to locate the reservoir physically near the electronics component 106, or other heat generating components, for this purpose. In this case, the reservoir 108 may be able to absorb aerothermal energy or near electronics or other heat producing components. The effect of allowing the reservoir 108 to absorb heat prior to initiation and release would be to increase the pressure of the compressible fluid within the reservoir 108. This could allow for tailoring of the Joule-Thompson cooling coefficient and/or or allowing for a lower storage pressure required at assembly.

In certain embodiments, the heat exchange volume 116 can be or include a manifold array such that cooled compressible fluid can be directed to specific areas of the electronics assembly 104, such as electronics exhibiting higher temperatures. For example, in specific CONOPs, different components 106 may experience temperature increases at different times, such that the manifold array is able to direct the cooled compressible fluid to each component as it is needed. In certain embodiments, multiple throttling orifices 114, and enlarged fluid channels may be included in the thermal management system 200 to allow for a multi-stage expansion approach for further cooling effects and to mitigate excess temperature increase in the compressible fluid.

In certain embodiments, the thermal management system 200 can be in thermal communication with an outer shell 118 of the platform body 102. In certain embodiments, the heat exchange volume 116 can be in thermal communication with a cooling path 120 housing a working fluid, and configured to exchange heat between the working fluid and the compressible fluid in the heat exchange volume 116 while maintaining fluid isolation between the compressible fluid and the working fluid. The cooling path 120 can be or include a 3D printed, micro-machined or wire EDM flow channel. The cooling path 120 can be designed to increase the surface area in thermal contact with the compressible fluid and increase the thermal energy transfer between the working fluid and the compressible fluid.

In certain implementations, the compressible fluid can be directed through the cooling path, and over the heat exchange volume 116 to create a cooling effect that could induce a temperature differential and a thermal sink, thereby driving thermal transport through conductive means. In this case, the working fluid can be in thermal communication with the heat generating electronics component 106 to cool the heat generating electronics component 106 via any suitable means (e.g., as discussed above). While in FIG. 1, the cooling path 120 is shown near, or surrounding the electronics assembly 104 and electronics components 106, it is contemplated the cooling path could be located elsewhere in the platform body 102 (e.g., separate from the electronics assembly 104 and heat generating electronics 106). Any suitable arrangement of the heat exchange volume 116 and cooling path 120 in relation to the electronics component 106 within the platform body 102, and any suitable combination of heat exchange volume structures is contemplated herein.

In certain embodiments, the electronics assembly 104 may include certain, isolated electronics components 107, (e.g. an infrared (IR) sensor, a radio frequency (RF) seeker, a datalink, an RF communication module, or the like), which may generate less heat than components 106. Because the electronics components 107 typically generate little to negligible heat during use, components 107 can be separate from the electronics components 106 within assembly 104, or may be separate from the assembly 104 altogether. The electronics components 107 therefore may not need cooling from a thermal management system 200, or they may include separate systems for temperature maintenance, outside of thermal management system 200. It is possible there may be some instances in which the thermal management system 200 may act to cool the electronics components 107 in addition to cooling the other, heat generating components 106 in the electronics assembly 104, whether partially, wholly, intentionally, or incidentally. In embodiments where the thermal management system 200 is separate from the components 107 within the platform body 102, a temperature maintenance system for the components 107 can be aboard an aircraft that releases the guided munition 100 (e.g. in the rails).

Figure 3:
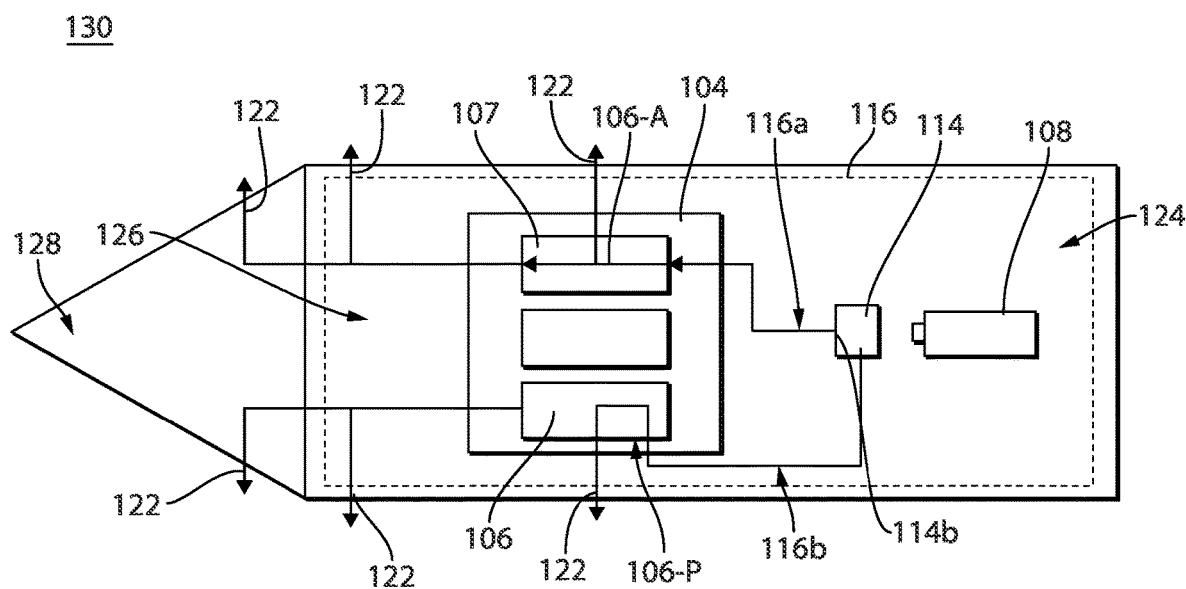
FIG. 3 is a schematic plan view of an embodiment of a cooling path of the thermal management system of FIG. 1.

Referring now to FIG. 3, in certain embodiments, the heat exchange volume 116 can be configured to direct, via any suitable means, the cooled compressible fluid in a first path 116a from a throttling orifice outlet 114b to and along a centerline 106-A of the heat generating electronics component 106, then outward from the centerline 106-A to any number of exhaust path outlets 122. Still with reference to FIG. 3, in certain embodiments, the heat exchange volume 116 can be configured to direct, via any suitable means, the cooled compressible fluid in a second path 116b from the throttling orifice outlet 114b to a periphery 106-P of the heat generating electronics component 106, then inward to the centerline 106-A, then outward from the centerline to any number of exhaust path outlets 122. As shown, the heat exchange volume 116 can be configured to direct the cooled compressible fluid from the throttling orifice outlet 114b to a location 124 aft of the heat generating electronics component 106, then along the heat generating electronics component 106 to a location 126 forward of the heat generating electronics component 106 and to the exhaust path outlet 122.

Figure 4:
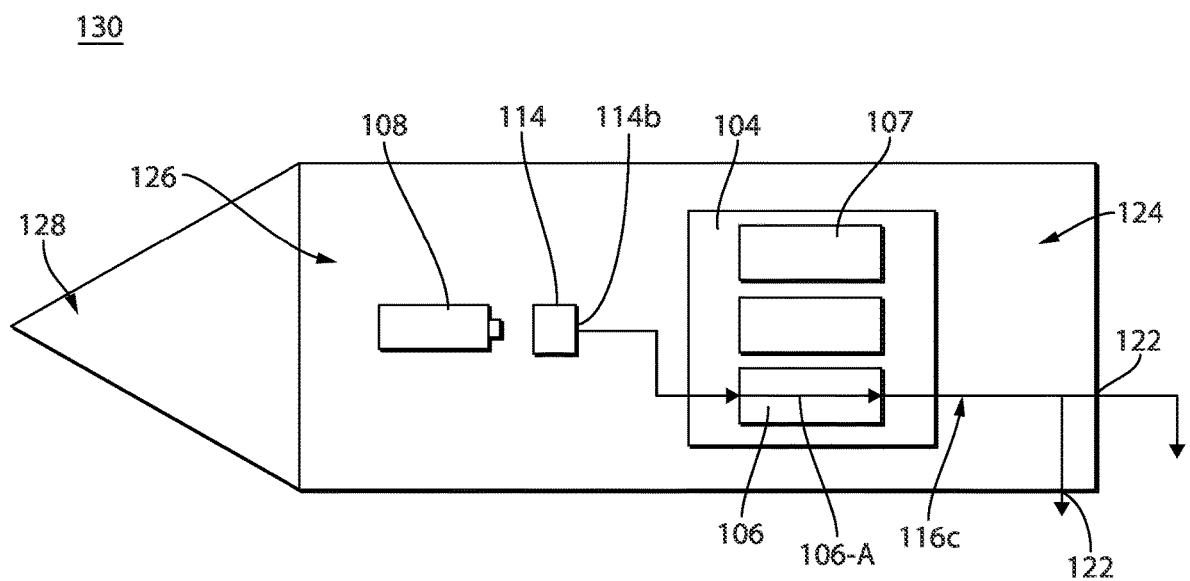
FIG. 4 is a schematic plan view of an embodiment of another cooling path of the thermal management system of FIG. 1.
Figure 5:
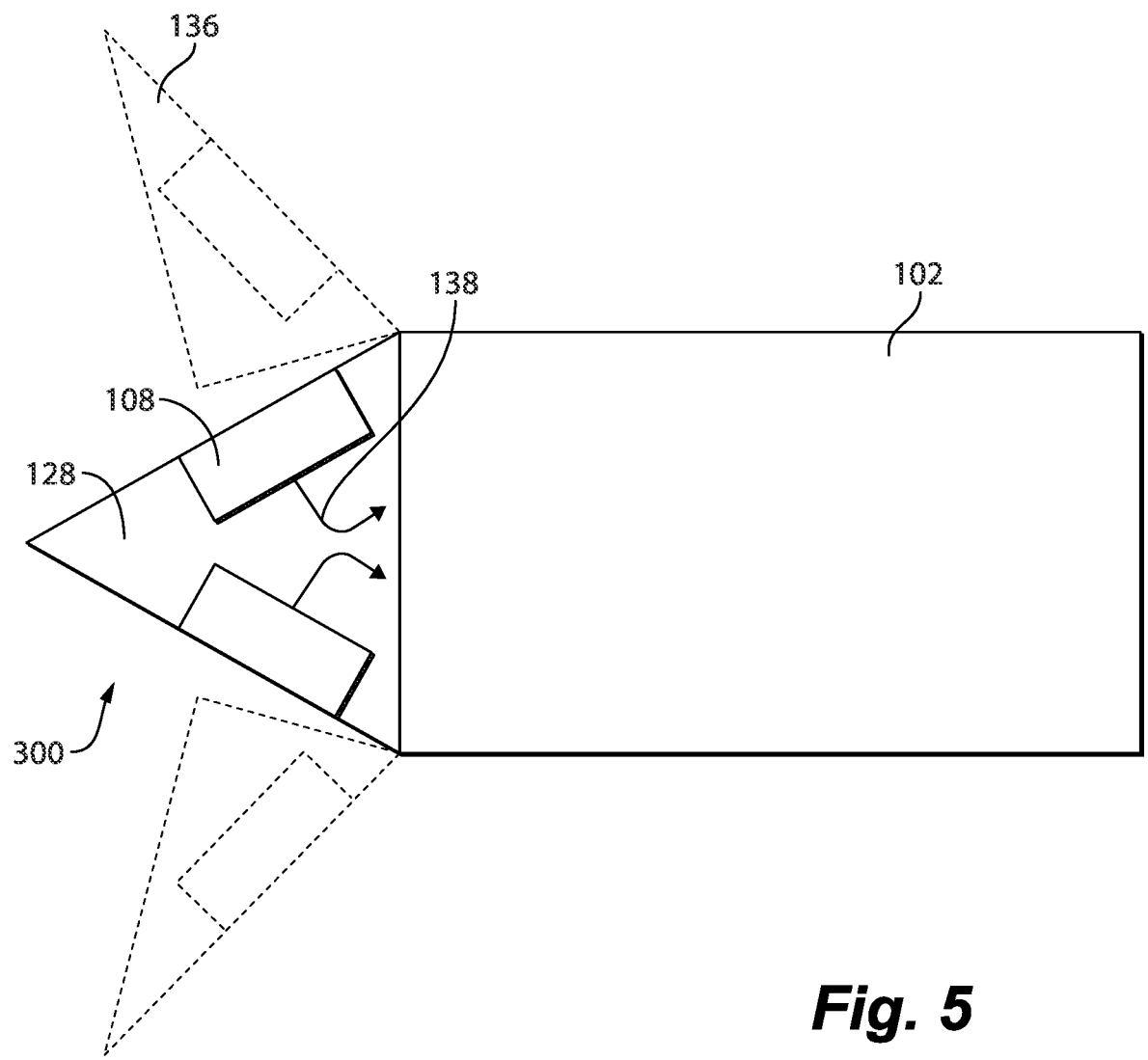
FIG. 5 is a schematic plan view of an arrangement of a thermal management system of FIG. 1, e.g., for nose cone ejection.

As shown in FIG. 4, in certain embodiments, the heat exchange volume 116 can be configured to direct the cooled compressible fluid, via any suitable means, from the throttling orifice outlet 114b to via a third path 116c a location 126 forward of the electronics component 106, then along the electronic component 106 to a location 124 aft of the electronics component 106 via the exhaust path outlet 122. It should be appreciated that first and second paths 116a, 116b can be tailored to be used in the arrangement shown in FIG. 4, even if not specifically shown herein. In certain embodiments, the forward location 126 can include housing at least the reservoir 108 of the thermal management system 200 in a nose cone 128 of the moving platform 100, such as shown in FIG. 5. In certain embodiments, the system 200 can include multiple reservoirs 108, where at least one reservoir 108 is located in the nose cone 128 of the platform 100, and at least one reservoir 108 is located in the platform body 102. Any suitable combinations of reservoir arrangements and fluid paths in and through the moving platform 100 as shown and described is contemplated herein.

Figure 7:
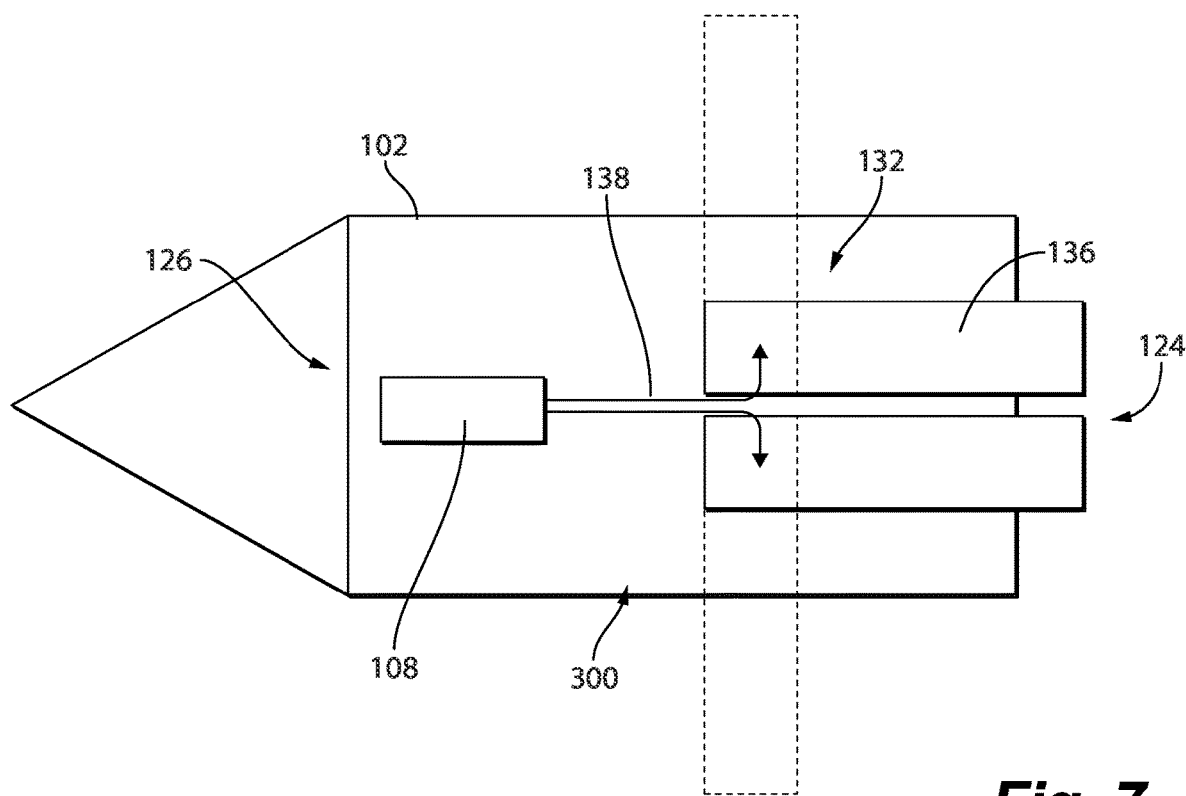
FIG. 7 is a schematic plan view of another arrangement of a thermal management system of FIG. 1, e.g., for canard and/or wing release.
Figure 8:
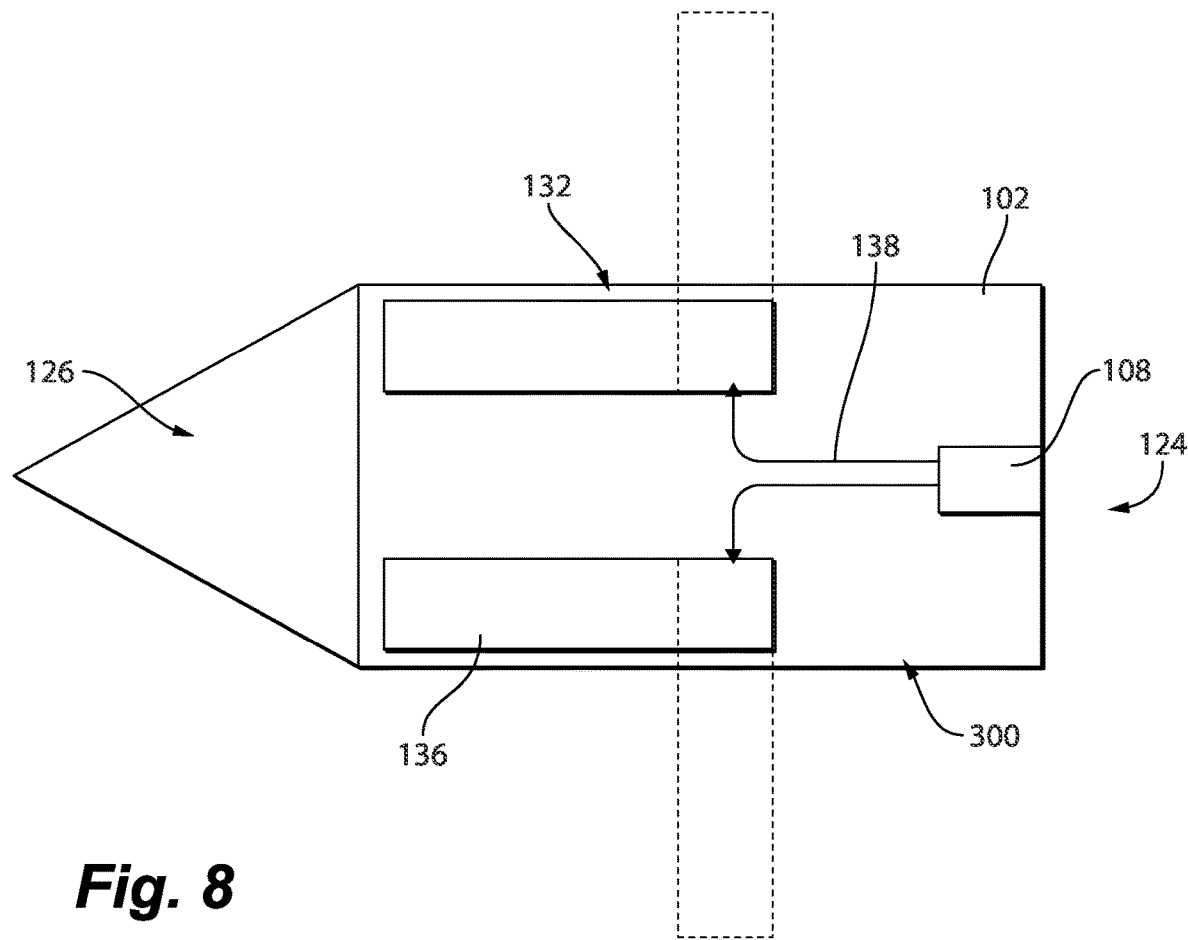
FIG. 8 is a schematic plan view of another arrangement of a thermal management system of FIG. 1, e.g., for canard and/or wing release.

The exhaust path outlet 122 can fluidly connect the heat exchange volume 116 to an ambient environment 130 external to the heat exchange volume via the exhaust path outlet. As shown in FIGS. 1, 3, and 4, the exhaust path outlet 124 can be defined in the outer shell 118 of the platform body 102 to empty the spent compressible fluid to the ambient air 130 surrounding the platform 100 as it flies, for example as shown in FIG. 1. In certain embodiments, in addition to or instead of the exhaust path outlet 122 defined in the platform body, the exhaust path outlet 122 can be defined in the nose cone 128 of the platform 100, as shown in FIGS. 1, 3, 4, and 6. In certain embodiments, the exhaust path outlet 122 can be defined by the Canard Actuation System (CAS) 132, for example as shown in FIGS. 7 and 8. In embodiments, the exhaust path outlet 122 can be a passive port open to the ambient environment, a valved opening controllable by any suitable means, plugged with a device or material that ejects when over-pressured, covered with an acceleration initiated membrane, and/or other initiation methods.

Referring now to FIGS. 5-8, in certain embodiments, the exhaust path can be used as an actuation system 300 configured to move a moveable component 136 mounted to the platform body 102, for example at least one of a nose cone segment, a canard, a wing, or the like. The actuation system 300 can include, in addition to the elements described above with respect to the thermal management system 200, an actuation path 138 (e.g., paths 116a, 116b, 116c) connecting the heat exchange volume 116 in fluid communication with the moveable component 136. The actuation path 138, therefore, can be configured to supply pneumatic pressure to the moveable component 136 to move the moveable component 136 relative to the platform body 102, for example from a stowed position to a deployed position (e.g., a locked position and an in-flight position, respectively). Because the actuation system 300 utilizes the exhausted compressible fluid, the compressible fluid is directed, via any suitable path described herein, to cool the heat exchange volume 116 via a cooling path prior to entering the actuation path 138.

Figure 6:
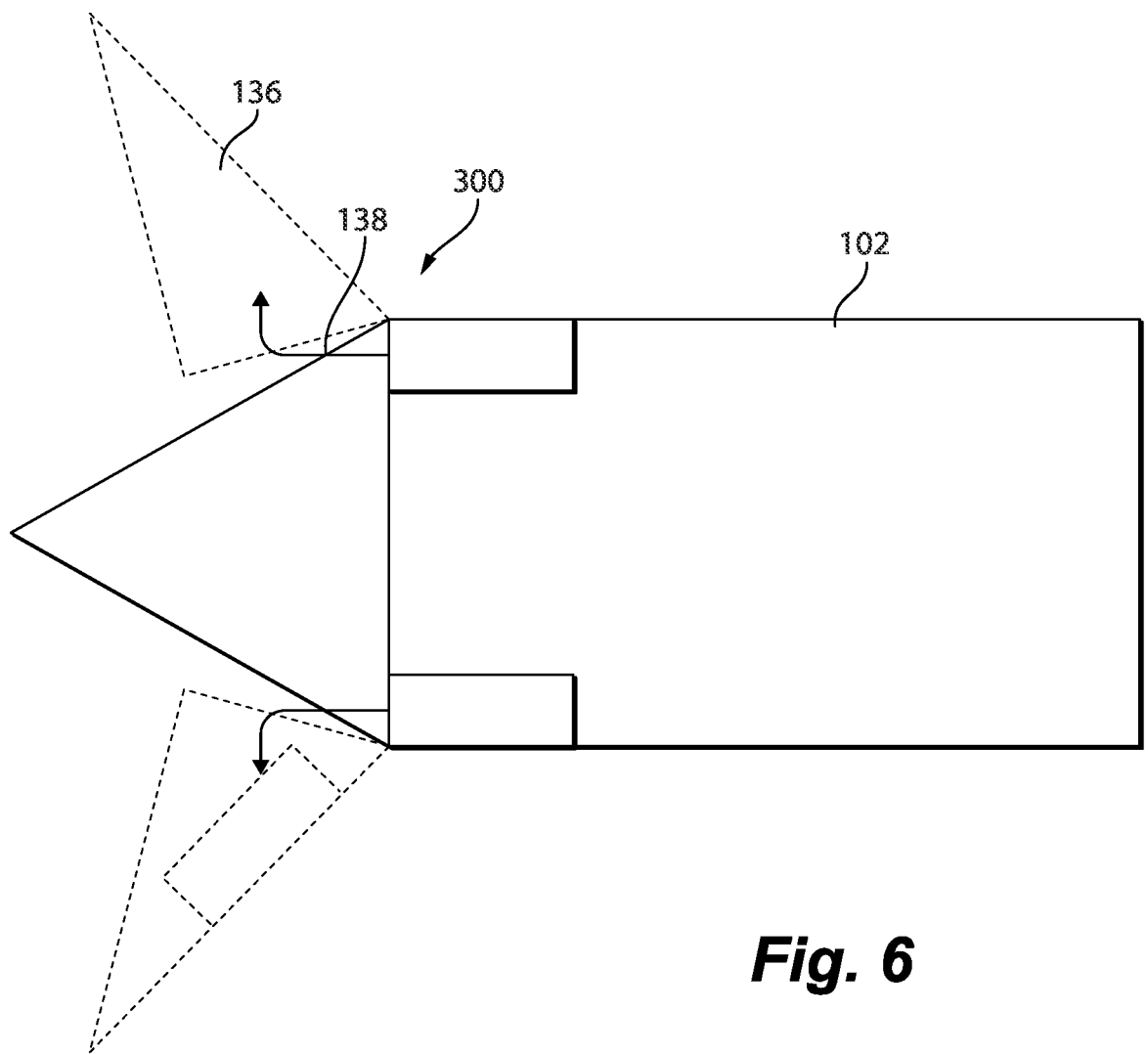
FIG. 6 is a schematic plan view of another arrangement of a thermal management system of FIG. 1, e.g., for nose cone ejection.

As shown in FIGS. 5 and 6, in certain embodiments, the moveable component 136 can be or include a nose cone segment mounted to the platform body 102. In certain such embodiments, the compressible fluid is directed, via any suitable path, from the throttling orifice 114b outlet to the heat exchange volume 116, and toward the respective nose cone segment 136 to move the nose cone segment 136 outward from the platform body 102. In certain embodiments, such as shown in FIG. 5, the actuation system 300 can be included in the nose cone 128, where the compressible fluid can be directed from the throttling orifice outlet 114b to the heat exchange volume 116 and away from a respective nose cone segment 136 to move the respective nose cone segment 136 from the stowed position to the deployed position. In certain embodiments, the actuation system 300 can be configured to be ejected with the respective nose cone segment 136 upon actuation of the actuation system 300.

As shown in FIG. 6, the actuation system 300 can be included the platform body 102, where the compressible fluid can be directed from the throttling orifice outlet 114b to the heat exchange volume 116 and away towards the respective nose cone segment 136 to move the respective nose cone segment 136 from the stowed position to the deployed position, such that the compressible fluid is exhausted to the ambient environment 130 but the actuation system 300 is not ejected with the nose cone segment 136.

Referring now to FIGS. 7 and 8, in certain embodiments, the moveable component 136 can be or include at least one of a canard 136 in the CAS 132, and/or a wing 136. In certain such embodiments, the actuation system 300 can be included in the platform body 102 such that the compressible fluid can be directed, via any suitable path, from the throttling orifice outlet 114b to the heat exchange volume 114 and toward the respective canard 136 to move the respective canard and/or wing 136 from the stowed position to the deployed position. In certain such embodiments, the actuation system 300 can be included in any suitable position within the guided munition body 102 relative to the moveable component 136, such as shown in FIG. 7, where the reservoir 108 and throttling orifice 114 can be positioned forward of the moveable component 136, or, such as shown in FIG. 8, the reservoir 108 throttling orifice 114 can be positioned aft the moveable component 136, for example.

In accordance with at least one aspect of this disclosure, a method of cooling an electronics assembly (e.g., electronics assembly 104) of a moving platform (e.g., platform 100) can include discharging a compressible fluid from an onboard reservoir (e.g. reservoir 108) into a heat exchange volume (e.g., volume 116) of the moving platform, expanding the compressible fluid to cool the compressible fluid, flowing the cooled compressible fluid through the heat exchange volume into thermal communication with a heat generating electronics component (e.g., component 106) of the electronics assembly, and exhausting the compressible fluid to an ambient environment (e.g., environment 130) external to the heat exchange volume.

In certain embodiments, expanding the compressible fluid can include passing the compressible fluid through a throttling orifice (e.g., orifice 114), and further comprising controlling a temperature drop (e.g., by changing the number and relative size(s) of throttling orifice(s)) of the compressible fluid with the throttling orifice. The specific temperature of the cooled compressible fluid should be carefully controlled and monitored so that the cooled temperature remains within the operational temperature range of the electronics.

In embodiments, the method can further include monitoring (e.g., using a control thermal feedback loop) a temperature of the electronics component, monitoring a temperature of the heat exchange volume, and controlling at least one of discharge of the compressible fluid and/or expansion of the compressible fluid as a function the temperature of the electronics component and the temperature of the heat exchange volume. For example, any suitable number of active controlled valves could be added to the control thermal feedback loop, to control the amount of fluid expansion at a given time based on one or both of the temperature of the electronics component and thus resulting in controlled temperature.

In accordance with at least one aspect of this disclosure, a method (e.g., for actuating a moveable component of the moving platform 100) can include, discharging the compressible fluid from the onboard reservoir into a body of the moving platform, expanding the compressible fluid though a throttling orifice, flowing the compressible fluid through a fluid path from the throttling orifice to a heat exchange volume, exhausting the compressible fluid from the heat exchange volume to an actuation path of a moveable component (e.g., component 136) of the moving platform, and actuating the moveable component with the exhausted compressible fluid. In embodiments, actuating the moveable component can include actuating at least one of a respective nose cone segment mounted to the platform body, and/or a respective canard mounted to the guided munition body.

In embodiments, as the size of electronics decreases, the power density can drastically increase, resulting in the need for new thermal mitigation techniques. In certain embodiments, heatsinks or heat pipes can be used in conjunction with the systems as described herein, for example to transport heat to certain other components. In certain embodiments, it may not be desirable to use active cooling techniques that require power, because in a guided munition, there may be a limited amount of power available to operate such active system. Additionally, active cooling system can, in certain instances, less efficient, and can contribute to the overall system thermal load.

In certain embodiments, guided munition CONOPs can be relatively short, therefore the duration which the thermal load applied can be equally short. In this case, it may be desirable to utilize energy that can be added to the system prior to launch and/or be extracted from the launch or flight. Embodiments, utilize the properties of the ideal gas law and Joule-Thomson effect to cool the electronics through the expansion of compressed gas. In embodiments, the high levels of acceleration experienced by a munition during a launch event can be used to initiate the release of the compressed gas. An external sink can be created for: heat to travel to through conduction, a cooling gas may move through a heatsink to remove heat through conduction, or may move across a heat producing electronic component to remove heat through conduction and convection. This process removes heat from the source in the electronics and keeps the components: below max operating temperatures, operating more efficiently, and from failing due to over temperature situations.

Embodiments can be particularly useful in CONOPs in certain environments, such as a desert, where ambient temperatures are high and adding to that initial temperature.

Other circumstances, such as a hot gun environment (created by a hold fire order after a recent launch), could increase temperatures to where all or most of the operational temperature range is used up before launch. Additionally, a high velocity launch could further add to the heat load applied to the electronics through supersonic shockwave thermal effects.

One problem currently faced in the art in shrinking electronics is increased power density resulting also in increased density of thermal energy, heat. Embodiments can therefore utilize a passive technique that can be used directly at the heat source to absorb and/or remove heat to drive thermal transport. Embodiments can employ the Joule-Thomson effect where the compressed gas is throttled through an orifice, below its inversion temperature, and expanded into a larger volume, creating a cooling effect. In embodiments, the cooled gas can be utilized to decrease the temperature of electronics through channeling it on or near the electronic components, or through the use of heat exchangers or heatsinks. In current applications the compressed gas is added to the munition from an external source, e.g. mounting rail, and is meant to cool a sensor to cryogenic temperatures such that the background noise in the sensor is greatly reduced, increasing performance. Unlike these implementations, embodiments carry the compressed gas stored within the munition and release it into an open loop, exhausting externally. The intent of the cooling gas is to maintain the electronics in the munition at a cooled temperature that is within the operating temperature range and prevent the electronics from going into thermal runaway.

Embodiments can maintain internal munition temperatures and electronics temperatures within an acceptable operating range with a potential to use less expensive automotive or commercial grade components.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A thermal management system for an electronics assembly, comprising:
    a reservoir housing a compressible fluid in a compressed state;
    a throttling orifice disposed in fluid communication with the reservoir and configured to expand the compressible fluid, cooling the compressible fluid;
    a heat exchange volume in fluid communication with the throttling orifice to receive cooled compressible fluid from the throttling orifice; and
    an exhaust path fluidly connecting the heat exchange volume to an ambient environment external to the volume via an exhaust path outlet, wherein the reservoir includes a passive pressure release mechanism configured to retain the compressible fluid at a first predetermined pressure and configured to allow discharge of the compressible fluid at a second predetermined pressure.

2. The system as recited in claim 1, wherein the thermal management system is configured to cool an electronics assembly within a moving platform.

3. The system as recited in claim 2, wherein the moving platform includes a guided munition.

4. The system as recited in claim 2, wherein the cooled compressible fluid is in fluid communication with the heat exchange volume to cool the heat exchange volume through convection, and wherein the heat exchange volume is in thermal communication with a heat generating electronics component of the electronics assembly to remove heat from the heat generating electrics component through conduction.

5. The system as recited in claim 1, wherein the reservoir is configured to discharge the compressible fluid upon acceleration of the moving platform.

6. The system as recited in claim 1, wherein the compressible fluid includes at least one of carbon dioxide, nitrogen, argon, neon and/or krypton.

7. A moving platform comprising:
    a platform body;
    an electronics assembly housed within the platform body, the electronics assembly comprising an electronics component; and
    a thermal management system configured to cool the electronics assembly, comprising:
        a reservoir disposed in the platform body, housing a compressible fluid in a compressed state;
        a throttling orifice disposed in fluid communication with the reservoir and configured to expand the compressible fluid, cooling the compressible fluid;
        a heat exchange volume in fluid communication with the throttling orifice to receive cooled compressible fluid from the throttling orifice; and
        an exhaust path fluidly connecting the heat exchange volume to an ambient environment external to the volume via an exhaust path outlet, wherein the reservoir includes a passive pressure release mechanism configured to retain the compressible fluid at a first predetermined pressure and configured to allow discharge of the compressible fluid at a second predetermined pressure.

8. The platform as recited in claim 7, wherein the reservoir is positioned in the platform body such that the reservoir is configured to absorb heat from inside the platform body.

9. The platform as recited in claim 8, wherein the reservoir includes at least one reservoir, wherein the at least one reservoir is housed in at least one of a nose of the platform body and/or in thermal communication with an outer shell of the platform body.

10. A method of cooling an electronics assembly of a moving platform, comprising:
    discharging a compressible fluid from an onboard reservoir into a heat exchange volume of the moving platform, wherein the reservoir includes a passive pressure release mechanism configured to retain the compressible fluid at a first predetermined pressure and configured to allow discharge of the compressible fluid at a second predetermined pressure;

expanding the compressible fluid to cool the compressible fluid;

flowing the cooled compressible fluid through the heat exchange volume into thermal communication with a heat generating electronics component of the electronics assembly; and exhausting the compressible fluid to an ambient environment external to the volume.

11. The method as recited in claim 10, further comprising;
monitoring a temperature of the electronics component;
monitoring a temperature of the heat exchange volume; and
controlling expansion of the compressible fluid as a function the temperature of the electronics component and the temperature of the heat exchange volume.

12. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;
a heat exchange volume in fluid communication with the throttling orifice to receive cooled compressible fluid from the throttling orifice; and
an exhaust path fluidly connecting the heat exchange volume to an ambient environment external to the volume via an exhaust path outlet,
wherein the thermal management system is configured to cool an electronics assembly within a moving platform,
wherein the cooled compressible fluid is in fluid communication with the heat exchange volume to cool the heat exchange volume through convection, and wherein the heat exchange volume is in thermal communication with a heat generating electronics component of the electronics assembly to remove heat from the heat generating electrics component through conduction,
wherein the heat exchange volume is configured to direct the cooled compressible fluid from the throttling orifice outlet to and along a centerline of the heat generating electronics component, then outward from the centerline to the exhaust path outlet.

13. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;
a heat exchange volume in fluid communication with the throttling orifice to receive cooled compressible fluid from the throttling orifice; and
an exhaust path fluidly connecting the heat exchange volume to an ambient environment external to the volume via an exhaust path outlet,
wherein the thermal management system is configured to cool an electronics assembly within a moving platform,
wherein the cooled compressible fluid is in fluid communication with the heat exchange volume to cool the heat exchange volume through convection, and wherein the heat exchange volume is in thermal communication with a heat generating electronics component of the electronics assembly to remove heat from the heat generating electrics component through conduction,
wherein the heat exchange volume is configured to direct the cooled compressible fluid from the throttling orifice outlet to a periphery of the heat generating electronics component, then inward to a centerline of the heat generating electronics component, then outward from the centerline to the exhaust path outlet.

14. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;
a heat exchange volume in fluid communication with the throttling orifice to receive cooled compressible fluid from the throttling orifice; and
an exhaust path fluidly connecting the heat exchange volume to an ambient environment external to the volume via an exhaust path outlet,
wherein the thermal management system is configured to cool an electronics assembly within a moving platform,
wherein the cooled compressible fluid is in fluid communication with the heat exchange volume to cool the heat exchange volume through convection, and wherein the heat exchange volume is in thermal communication with a heat generating electronics component of the electronics assembly to remove heat from the heat generating electrics component through conduction,
wherein the heat exchange volume is configured to direct the cooled compressible fluid from the throttling orifice outlet to a location aft of the heat generating electronics component, then along the heat generating electronics component to a location forward of the heat generating electronics component and to the exhaust path outlet.

15. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;
a heat exchange volume in fluid communication with the throttling orifice to receive cooled compressible fluid from the throttling orifice; and
an exhaust path fluidly connecting the heat exchange volume to an ambient environment external to the volume via an exhaust path outlet,
wherein the thermal management system is configured to cool an electronics assembly within a moving platform,
wherein the moving platform includes a guided munition,
wherein the heat exchange volume is configured to direct the cooled compressible fluid from the throttling orifice outlet to a location forward of the heat generating electronics, then along the heat generating electronics to a location aft of the heat generating electronics and to the exhaust path outlet.

16. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;

a heat exchange volume in fluid communication with the throttling orifice to receive cooled compressible fluid from the throttling orifice, wherein the heat exchange volume is in thermal communication with a cooling path housing a working fluid, and is configured to exchange heat between the working fluid and the compressible fluid in the heat exchange volume while maintaining fluid isolation between the compressible fluid and the working fluid, wherein the working fluid is thermal communication with a heat generating electronics component to cool the heat generating electronics component.

17. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;
a heat exchange volume in fluid communication with the throttling orifice to receive cooled compressible fluid from the throttling orifice, wherein the reservoir further includes an actuated discharge valve, and further comprising a controller operatively connected to control the actuated discharge valve to discharge the compressible fluid at a predetermined time.

18. A thermal management system for an electronics assembly, comprising:
a reservoir housing a compressible fluid in a compressed state;
a throttling orifice disposed in fluid communication with the reservoir and configured to expand the compressible fluid, cooling the compressible fluid;
a heat exchange volume in fluid communication with the throttling orifice to receive cooled compressible fluid from the throttling orifice,
wherein the reservoir includes an active pressure release mechanism configured to retain the compressible fluid at a first predetermined pressure and configured to allow discharge of the compressible fluid at a second predetermined pressure.

* * * * *

UNITED STATES PATENT AND TRADEMARK OFFICE
CERTIFICATE OF CORRECTION

| | | |
|---|---|---|
| PATENT NO. | : 12,068,422 B2 | Page 1 of 1 |
| APPLICATION NO. | : 17/497874 | |
| DATED | : August 20, 2024 | |
| INVENTOR(S) | : Bibeau et al. | |

It is certified that error appears in the above-identified patent and that said Letters Patent is hereby corrected as shown below:

In the Specification

In Column 8, Line 38, delete "124" and insert --122-- therefor

In Column 9, Line 41, delete "114" and insert --116-- therefor

Signed and Sealed this
Twenty-second Day of July, 2025

Coke Morgan Stewart
*Acting Director of the United States Patent and Trademark Office*